(12) United States Patent
Uchida et al.

(10) Patent No.: US 6,653,738 B2
(45) Date of Patent: Nov. 25, 2003

(54) SEMICONDUCTOR DEVICE

(75) Inventors: Kiyohiro Uchida, Tokyo (JP); Keisuke Tsutsumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/183,402

(22) Filed: Jun. 28, 2002

(65) Prior Publication Data

US 2003/0034485 A1 Feb. 20, 2003

(30) Foreign Application Priority Data

Aug. 13, 2001 (JP) ........................................ 2001-245365

(51) Int. Cl.$^7$ ............................................. H01L 23/482
(52) U.S. Cl. .................... 257/762; 257/766; 257/767
(58) Field of Search ................................. 257/762, 766, 257/767

(56) References Cited

U.S. PATENT DOCUMENTS 3,599,060 A * 8/1971 Triggs et al. ................ 257/762

* cited by examiner

*Primary Examiner*—Jerome Jackson
(74) *Attorney, Agent, or Firm*—Oblon, Spivak, McClelland, Maier & Neustadt, P.C.

(57) ABSTRACT

The semiconductor device has a backside electrode disposed on a backside of the semiconductor substrate and including multiple layers of metal. The backside electrode includes, on the semiconductor substrate, a first layer of aluminum, a second layer of barrier metal, a third layer of nickel, a fourth layer of silver and a fifth layer of gold which are disposed in this order.

14 Claims, 1 Drawing Sheet

SEMICONDUCTOR DEVICE

BACKGROUND OF THE INVENTION

1. Field of the Invention

The present invention relates to semiconductor device having a backside electrode for solder mounting, which is formed on a back side of a p-type semiconductor substrate.

2. Description of the Prior Art

The backside electrode is formed on the back side of the substrate of the semiconductor device having the p-type semiconductor substrate such as a diode, a bipolar-diode and IGBT.

FIG. 2 is a schematic cross-sectional view of a part of a conventional semiconductor device. In this figure, reference numeral 51 is a p-type semiconductor substrate, and reference numeral 52 is a backside electrode formed on the p-type semiconductor substrate 51. The backside electrode 52 includes a first metal layer 53 of aluminum, a second metal layer 54 of molybdenum or titanium as a barrier metal layer, a third metal layer 55 of nickel solderable to a lead frame and the substrate and an outermost fourth metal layer of gold. First metal layer 53 of aluminum has a low barrier height against silicon and can lower Vf which is a voltage drop of the on state semiconductor device. Fourth metal layer 56 of gold is formed to prevent the oxidation of third metal layer 55 of nickel.

The backside electrode is formed by depositing the above mentioned four metal layers on the back side of the substrate and subsequently by subjecting to a heat treatment to form a good ohmic contact between first metal layer 53 of aluminum and the semiconductor substrate 51. The semiconductor device is mounted on the substrate in such a way that the semiconductor device is bonded to the backside electrode by soldering.

SUMMARY OF THE INVENTION

However, it has been found that when the substrate and the backside electrode are subjected to a heat treatment so as to form a good ohmic contact between the substrate and the backside electrode, interdiffusion between nickel of the third metal layer and gold of the fourth metal layer occurs and a portion of nickel metal deposits on the outermost surface of the fourth metal layer of gold. The deposited nickel is immediately oxidized by a small amount of oxygen contained in an inert gas employed in the heat treatment, thereby to form a nickel oxide film on the outermost surface of the backside electrode. The resultant nickel oxide film prevents the semiconductor to be soldered to the substrate. Thus, the subsequent scrubbing process, which consists of rocking the semiconductor substrate in the planar direction, must to be carried out so as to destroy the nickel oxide film and to remove. A problem is that the scrubbing process is time-consuming and needs the complicated mounting apparatus.

Also, there is another problem that when displacing gold of the fourth metal layer with silver so as to prevent the interdiffusion of the nickel and gold, oxygen contained in the ambient atmosphere diffuses rapidly into the fourth metal layer of silver and oxidizes the third metal layer of nickel. As a result, the fourth metal layer of gold is easily peeled from the third metal layer of nickel.

An object of the present invention is therefore to provide a semiconductor device which does not need the scrubbing process following to the heat treatment and has a high reliability.

In order to achieve the object described above, the semiconductor device of the present invention includes a p-type semiconductor substrate, and a backside electrode disposed on a back side of the semiconductor substrate and including multiple layers of metal, the backside electrode including, on the semiconductor substrate, a first layer of aluminum, a second layer of barrier metal, a third layer of nickel, a fourth layer of silver and a fifth layer of gold which are disposed in this order.

The backside electrode of the present invention includes the layers of silver and gold disposed on the layer of nickel in that order. The layer of silver disposed between the layers of nickel and gold provides a barrier to inhibit an interdiffusion of nickel and gold, thereby to suppress the interdiffusion during the heat treatment process in the range of 350 to 500° C. Accordingly, the layer of silver can prevent nickel to diffuse and deposit on the outermost surface of the backside electrode to form nickel oxide film.

Furthermore, since the backside electrode of the present invention includes the layer of gold disposed on the layer of silver, the layer of gold can block the diffusion of ambient oxygen into the layer of nickel through the layer of silver. Accordingly, the layer of gold can prevent the layer of nickel from becoming oxidized.

Furthermore, the backside electrode of the present invention includes the layer of barrier metal which provides a barrier to inhibit the interdiffusion of aluminum and nickel. Accordingly, the layer of barrier metal can prevent nickel to form an alloy with the semiconductor substrate and also prevent aluminum to diffuse and deposit on the outermost surface of the backside electrode to form aluminum oxide film.

Also according to the present invention, the layer of barrier metal may be formed of molybdenum or titanium.

Also according to the present invention, the fourth layer of silver and the fifth layer of gold may have a thickness of more than 400 nm and 200 nm, respectively, and the thickness of the fourth layer may be two times larger than that of the fifth layer.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals.

DETAILED DESCRIPTION OF THE PREFERRED EMBODIMENTS

The present disclosure relates to subject matter contained in application No. 2001-245365 filed Aug. 13, 2001 in Japan, which are expressly incorporated herein by reference in their entirely.

Figure 1:
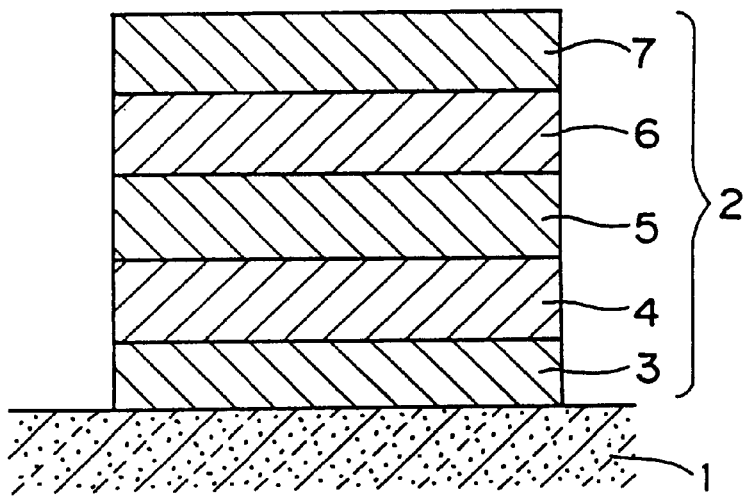
FIG. 1 is a schematic sectional view showing the structure of the semiconductor device according to an embodiment of the present invention.
Figure 2:
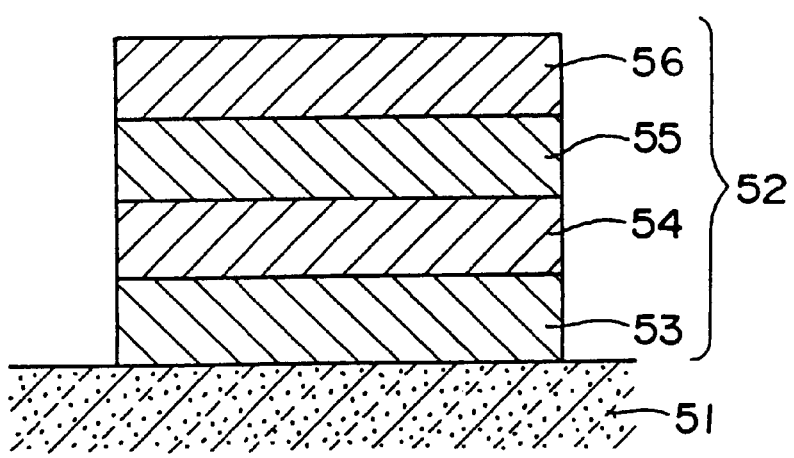
FIG. 2 is a schematic sectional view showing the structure of the semiconductor device according to the prior art.

FIG. 1 is a schematic sectional view of the semiconductor device according to an embodiment of the present invention. The semiconductor device shown therein includes a semiconductor substrate 1 of p-type and a backside electrode 2 disposed on the backside of the semiconductor substrate 2. The backside electrode 2 includes a first layer of aluminum disposed on the semiconductor substrate 2, a second layer of molybdenum disposed on the first layer, a third layer of nickel disposed on the second layer, a fourth layer of silver disposed on the third layer and a fifth layer of gold disposed on the fourth layer.

The method of forming the backside electrode will be described below. The above-mentioned five layers of metal are formed in sequence on the backside of the semiconductor device using vacuum deposition techniques.

The first layer of aluminum, which is an ohmic contact layer with the p-type semiconductor substrate, can have a thickness preferably within the range of 200 to 1000 nm.

The second layer of molybdenum, which is a layer of barrier metal, can have a thickness preferably within the range of 100 to 300 nm. Titanium may be employed in place of molybdenum. The third layer of nickel, which improves the adhesion property to the solder, can have a thickness preferably within the range of 200 to 800 nm.

The fourth layer of silver, which inhibits the interdiffusion of nickel and gold, can have a thickness preferably within the range of 400 to 2000 nm. When the thickness is smaller than 400 nm, the interdiffusion of silver and gold is promoted, thereby to decrease the thickness of the layer of silver still more. As a result, nickel is easily oxidized. When the thickness is greater than 2000 nm, further effect of inhibiting the interdiffusion can not be obtained.

The fifth layer of gold, which suppress the ambient oxygen to diffuse into the layers of silver and nickel, thereby to prevent the layers of silver and nickel from becoming oxidized, can have a thickness preferably within the range of 200 to 1000 nm. If the thickness is smaller than 200 nm, the layer of gold is less suppressive to the diffusion of the ambient oxygen. If the thickness is greater than 1000 nm, further effect of inhibiting the diffusion of the ambient oxygen can not be obtained.

Further, the layer of silver has a thickness preferably more than 2 times of that of the layer of gold. When the thickness of the layer of silver is smaller than 2 times of that of the layer of gold, the heat treatment promotes the interdiffusion of silver and gold, and results in the interdiffusion of nickel and gold.

Then the semiconductor substrate having the multiple layers of metal formed thereon must be subsequently subjected to a heat treatment under an inert atmosphere so as to form an ohmic contact between the semiconductor substrate and the backside electrode. In case that the ohmic contact layer is formed of aluminum, the temperature of the heat treatment is preferably within the range of 350 to 500° C.

Thereafter, a irradiation treatment employing such as electron rays, proton and helium, and the subsequent annealing treatment of heating at a temperature of about 300° C. can be carried out so as to increase the life of the semiconductor device.

EXAMPLE

1. Formation of the Backside Electrode

The layers of aluminum, molybdenum, nickel; silver and gold were deposited in this order on the backside of the semiconductor substrate by vacuum deposition techniques. The thickness of the layers of aluminum, molybdenum and nickel were 500 nm, 2000 nm and 300 nm, respectively. The thickness of the layers of silver and gold were changed in the range of 0 to 2000 nm and 0 to 200 nm, respectively.

2. Evaluation of the Solderability

Solder wettability and percentage of inter layer peeling of electrode were evaluated for the semiconductor device produced by the above-mentioned method. The solder wettability was measured by mi-scope ultrasonic inspection image analyzer (available from Hitachi Kenki Corporation.) and the percentage of rejection of soldering was calculated. The percentage of inter layer peeling of electrode was measured by universal bond tester 2400 (available from Daisy Corporation.) Further, surface analysis of the backside electrode was carried out by JAMP-30 auger electron spectroscopy apparatus (available from Nihon Denshi Corporation.). The percentage of rejection of solder, the inter layer peeling ratio of electrode and the result of the surface analysis are listed in Table. 1.

TABLE 1

| Sample No. | Thickness of the layers of silver and gold (nm) | | Concentration of detected element (atom %) | | | | Concentration of oxygen on the surface of the layer of nickel (atom %) | Percentage of rejection of soldering (%) | Percentage of interlayer peeling of electrode (%) |
|---|---|---|---|---|---|---|---|---|---|
| | Ag | Au | O | Ni | Au | Ag | O | | |
| Example | | | | | | | | | |
| 1 | 400 | 200 | 3.9 | 0 | 16.8 | 18.8 | 0 | 0 | 0 |
| 2 | 800 | 200 | 2.5 | 0 | 14.6 | 18.9 | 0 | 0 | 0 |
| Comparative Example | | | | | | | | | |
| 3 | — | 200 | 18.2 | 9.2 | 17.6 | — | 0 | 72 | 0 |
| 4 | 200 | 50 | 12.2 | 4.3 | 9.3 | 17.0 | 13 | 22 | 0 |
| 5 | 200 | 200 | 20.1 | 8.5 | 8.7 | 8.0 | 0 | 100 | 0 |
| 6 | 400 | 100 | 1.9 | 0 | 13.5 | 19.2 | 23 | 0 | 0 |
| 7 | 200 | — | 3.7 | 0 | — | 38.2 | 36 | 5 | 0 |
| 8 | 2000 | — | 10.7 | 0 | — | 26.0 | 7 | 2 | 81 |

When the thickness of the layers of gold and silver are more than 200 nm and 400 nm, respectively, and the thickness of the layer of silver is more than 2 times of that of the layer of gold (sample No. 1 and 2), nickel was not detected on the surface of the backside electrode and the percentage of rejection of soldering and the percentage of inter layer peeling of electrode were 0%, respectively.

Further, even though the layer of silver has a thickness more than 2 times of that of the layer of gold, when the thickness of layers of silver and gold are smaller than 200 nm and 400 nm, respectively, oxygen was detected on the surface of the layer of nickel (sample No. 4 and 6). This result indicates that the ambient oxygen diffuses into the layer of nickel.

Further, when only the layer of silver is formed on the layer of nickel without forming the layer of gold (sample Nos. 7 and 8), nickel was not detected on the surface of the backside electrode. However, oxygen was detected on the surface of the layer of nickel. It is possible to decrease the amount of oxygen, which diffuses into the surface of the layer of nickel by increasing the thickness of the layer of silver. However, when the thickness of the layer is greater than 2000 nm, the layer of silver is easily peeled off.

Further, when only the layer of gold is formed on the layer of nickel without forming the layer of silver (sample No. 3), nickel was detected on the surface of the backside electrode and the high percentage of rejection of solder, that is 72%, was obtained.

Further, even though the layer of gold has a thickness of 200 nm, when the thickness of layers of silver and gold each are smaller than 400 nm (sample No. 5), oxygen was detected on the surface of the backside electrode and the high percentage of rejection of solder, that is 100%, was obtained. This result indicates that the thinner the thickness of the layer of silver, the more the interdiffusion of silver and gold is promoted, thereby to decrease the thickness of the layer of silver still more. As a result, nickel can easily diffuse into the surface of the backside electrode.

Although the present invention has been fully described by way of example with reference to the accompanying drawings, it is to be noted here that various changes and modifications will be apparent to those skilled in the art.

Therefore, unless such changes and modifications otherwise depart from the spirit and scope of the present invention, they should be construed as being included therein.

As described above, since the semiconductor device of the present invention includes a backside electrode including multiple layers of metal and disposed on a back side of the semiconductor substrate, and since the backside electrode includes, on the semiconductor substrate, a first layer of aluminum, a second layer of barrier metal, a third layer of nickel, a fourth layer of silver and a fifth layer of gold disposed in this order, the formation of nickel oxide film can be suppressed during the heat treatment for forming the ohmic contact. As a result, the scrubbing process becomes unnecessary, thereby to improve the efficiency of the mounting process and the reliability of the solder mounting.

Also according to the present invention, since the layer of barrier metal is formed of molybdenum or titanium, the interdiffusion of nickel and aluminum can be suppressed, thereby forming a good ohmic contact. Thus Vf of the semiconductor device can be lowered.

Also according to the present invention, since the layers of silver and gold have a thickness of more than 400 nm and 200 nm, respectively, and the thickness of the layer of silver is more than two times of that of the layer of gold, the diffusion of nickel into the backside electrode and also the diffusion of ambient oxygen into the layer of nickel can be suppressed.

What is claimed is:

1. A semiconductor device comprising;
a p-type semiconductor substrate; and
a backside electrode disposed on a back side of said semiconductor substrate and comprising multiple layers of metal,
said backside electrode consisting of, on the semiconductor substrate, a first layer of aluminum, a second layer of barrier metal selected from the group consisting of molybdenum and titanium, a third layer of nickel, a fourth layer of silver and a fifth layer of gold which are disposed in this order.

2. The semiconductor device according to claim 1, wherein the layers of silver and gold have a thickness of more than 400 nm and 200 nm, respectively, and the thickness of the layer of silver is more than two times that of the layer of gold.

3. The semiconductor device according to claim 1, wherein the first layer of aluminum has a thickness within the range of 200 to 1000 nm.

4. The semiconductor device according to claim 1, wherein the barrier layer has a thickness within the range of 200 to 300 nm.

5. The semiconductor device according to claim 1, wherein the layer of nickel has a thickness within the range of 200 to 800 nm.

6. The semiconductor device according to claim 1, wherein the layer of silver has a thickness within the range of 400 to 2000 nm.

7. The semiconductor device according to claim 1, wherein the layer of gold has a thickness within the range of 200 to 1000 nm.

8. A semiconductor device comprising;
a p-type semiconductor substrate; and
a backside electrode disposed on a back side of said semiconductor substrate and comprising multiple layers of metal,
said backside electrode consisting of, on the semiconductor substrate, a first layer of aluminum, a second layer of barrier metal, a third layer of nickel, a fourth layer of silver of a thickness of more than 400 nm and a fifth layer of gold of a thickness of more than 200 nm, with the proviso that the thickness of the layer of silver is more than two times the thickness of the layer of gold, which are disposed in this order.

9. The semiconductor device according to claim 8, wherein the layer of barrier metal is formed of molybdenum or titanium.

10. The semiconductor device according to claim 8, wherein the first layer of aluminum has a thickness within the range of 200 to 1000 nm.

11. The semiconductor device according to claim 8, wherein the barrier layer has a thickness within the range of 200 to 300 nm.

12. The semiconductor device according to claim 8, wherein the layer of nickel has a thickness within the range of 200 to 800 nm.

13. The semiconductor device according to claim 8, wherein the layer of silver has a thickness within the range of 400 to 2000 nm.

14. The semiconductor device according to claim 8, wherein the layer of gold has a thickness within the range of 200 to 1000 nm.

* * * * *